(12) United States Patent
Kim

(10) Patent No.: US 7,134,064 B2
(45) Date of Patent: Nov. 7, 2006

(54) ERROR DETECTING METHOD AND APPARATUS

(75) Inventor: Sung-Deuk Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 534 days.

(21) Appl. No.: 10/713,272

(22) Filed: Nov. 17, 2003

(65) Prior Publication Data
US 2004/0210813 A1    Oct. 21, 2004

(30) Foreign Application Priority Data
Apr. 19, 2003  (KR) ................. 10-2003-0024925

(51) Int. Cl.
*H04N 7/64*  (2006.01)
*H04N 7/66*  (2006.01)
(52) U.S. Cl. ..................... 714/752; 348/466
(58) Field of Classification Search ............. 714/752; 348/466
See application file for complete search history.

(56) References Cited

U.S. PATENT DOCUMENTS 5,586,264 A * 12/1996 Belknap et al. ............. 725/115
5,668,948 A *  9/1997 Belknap et al. ............. 348/552
5,712,976 A *  1/1998 Falcon et al. ............... 725/115

FOREIGN PATENT DOCUMENTS

| CN | 1126011 | 7/1996 |
|---|---|---|
| CN | 1160962 | 10/1997 |

OTHER PUBLICATIONS

Chinese Office Action Dated Nov. 18, 2005.

* cited by examiner

*Primary Examiner*—R. Stephen Dildine
(74) *Attorney, Agent, or Firm*—Fleshner & Kim, LLP

(57) ABSTRACT

An error detecting method and apparatus may be provided for a moving image transmitting system. An error detection code may be generated for each data block of a frame. The generated error detection code may be inserted into a byte alignment code of the data block. The frame may then be transmitted from a transmitting side to a receiving side. A byte alignment code may be extracted from each data block after the frame is received at the receiving side. Errors may be detected based on the extracted code. The method may enable a moving image encoder to be stably operated and allow improvement of the picture quality. Also, the method may allow the byte alignment code, which has been regarded as meaningless information, to be associated with a channel code so as to enhance error detection efficiency.

24 Claims, 4 Drawing Sheets

N : MEANINGFUL BITS(STARTING CODE+IMAGE BLOCK DATA)
B : BYTE ALIGNMENT CODE(ERROR DETECTION CODE)
T : DATA BLOCK(MEANINGFUL BITS+BYTE ALIGNMENT CODE, MULTIPLE OF 8)

N : STARTING CODE & IMAGE BLOCK DATA
B : ERROR DETECTION CODE

ERROR DETECTING METHOD AND APPARATUS

This application is based upon and claims the benefit of priority from prior Korean Patent Application No. 24925/2003, filed Apr. 19, 2003.

BACKGROUND OF THE INVENTION

1. Field of the Invention

The present invention relates to error detecting, and more particularly relates to an error detecting methodology for a moving image transmitting system.

2. Background of Related Art

A moving image transmitting system may include a transmitting side and a receiving side that are coupled together by a channel. The channel may have a limited capacity in which to transmit information based on restricting conditions such as a band limit (or bandwidth) characteristics and/or background noise. When information is transmitted that exceeds a limit of the channel, there is a high probability that the receiving side may misjudge the information or even fail to receive all the information.

Channel coding may be used in view of those problems. One purpose of channel coding is to transmit as much information as possible. Another purpose of channel coding is to transmit information with as little error as possible. However, these two purposes of channel coding may be contradictory to each other.

Coding may involve converting an analogue signal into a data signal (or a digital signal). This may also be referred to as source coding. Channel coding is coding data that has undergone the source coding into another form. Channel coding may include an entropy coding, an error control coding, and an encryption, for example. These three types of coding will now be briefly discussed.

Entropy coding may reduce the number of data bits (i.e., data length) by compressing data so that the data can be transmitted as much as possible through a channel having a limited capacity. This technique for compressing data at the time of transmitting the image signal may be greatly utilized especially when an image signal has a large amount information (or data length).

Error control coding may involve coding source coded data into data of another form at the transmitting side. This may be done so that the receiving side can detect error bits and correct the data if an error is generated at an arbitrary bit at the time of data transmission. At this time, the source coded data is referred to as an information word, and the channel coded data is referred to as a code word. Transmission data between the receiving side and the transmitting side may include the information word and the code word. In order to control a transmission error, a transmitter (or the transmitting side) may transmit data including a redundancy bit added to an information bit. The receiving side may detect error bits of the received data using the redundancy bit and corrects the data. Error control coding may differ from entropy coding in that error control coding may increase an amount of data that is being transmitted.

Encryption is a technique for preventing information from being invaded without permission from outside, or from being arbitrarily fabricated. Transmission data between the transmitter and the receiver may include bits having no meaning (i.e., meaningless bits) such as a byte alignment code as well as meaningful bits such as the information word (or information bits) and the code word (or code bits).

FIG. 1 is an exemplary view of transmission data including a byte alignment code. Byte alignment may add several codes to a transmission data block so that the transmission data block can have a size relative to a number of byte units (i.e., a multiple of eight). For example, if a size of the transmission data block is 140 bits, then four '0' bit codes may be added to an end of the transmission data block. As another example, if a size of the transmission data block is 161 bits, then seven '0' bit codes may be added to an end of the transmission data block.

In video coding, a starting bit of a starting code is associated with a boundary of a byte in order to easily search for the starting code. The byte alignment code may be inserted into each block (or frame) of the transmission data. In some circumstances, a data block can exist without having any byte alignment code. If a size of the data block is a multiple of eight, then a corresponding data block may not have a byte alignment code.

In background art, a channel code may be transmitted in order to improve error detection efficiency. However, the amount of transmission data may increase. Additionally, since 24~30 minimum unit images (i.e., stationary images) may be transmitted per second for moving image data, the byte alignment code may lower the data transmission efficiency.

SUMMARY OF THE INVENTION

Embodiments of the present invention may provide an error detecting method for a moving image transmitting system. The method may utilize a byte alignment code corresponding to a channel code (such as an error detection code).

Embodiments of the present invention may provide an error detecting method for a moving image transmitting system. This may include generating an error detection code for each data block of a frame and inserting the generated error detection code into a byte alignment code of the data block. The frame may then be transmitted from a transmitting side to a receiving side. The method may include extracting the byte alignment code (including the error detecting code) from each data block when the frame is received. Errors may be detected by the extracted code.

Embodiments of the present invention may also include generating an error detection code by dividing a minimum unit image of a moving image into a plurality of image blocks and generating an error detection code for each data block.

Embodiments of the present invention may provide an error detection method that includes providing an error detection code within an alignment field of an image block, transmitting the image block having the error detection code, and determining whether an error has occurred based on the transmitted image block having the error detection code.

Other objects, features, aspects and advantages of the present invention will become more apparent from the following detailed description when taken in conjunction with the accompanying drawings.

BRIEF DESCRIPTION OF THE DRAWINGS

The invention will be described in detail with reference to the following drawings in which like reference numerals refer to like elements, wherein.

DETAILED DESCRIPTION OF PREFERRED EMBODIMENTS

Reference will now be made to various arrangements and embodiments of the present invention, examples of which are illustrated in the accompanying drawings.

Figure 1:
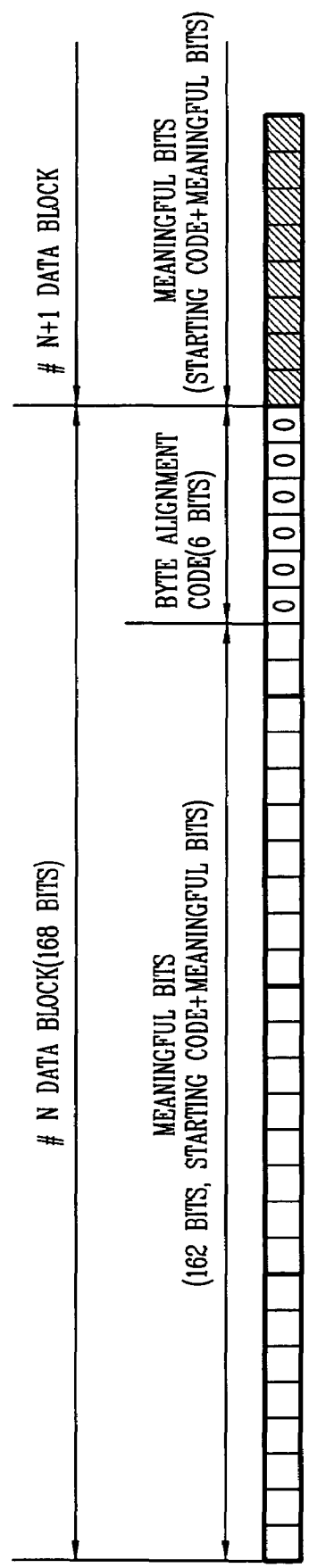
FIG. 1 is an exemplary view of transmission data including a byte alignment code.
Figure 2:
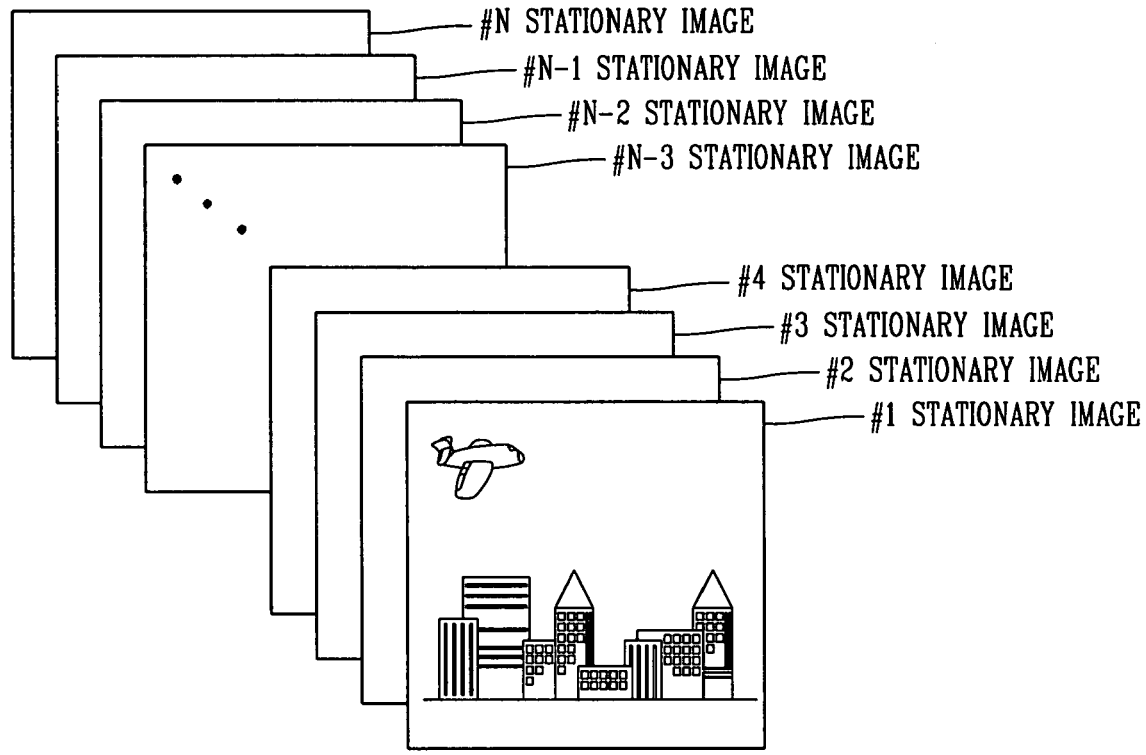
FIG. 2 shows moving image data formed by N stationary images.
Figure 3:
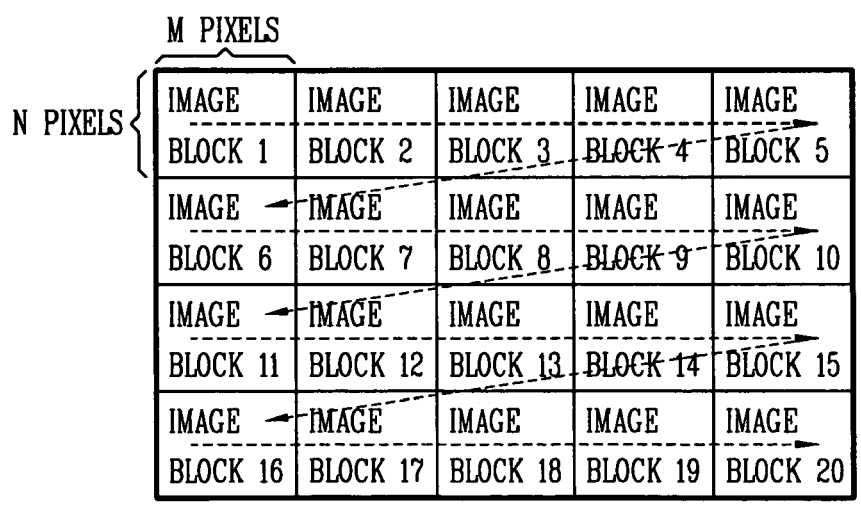
FIG. 3 shows a stationary image divided into a plurality of image blocks.

FIG. 2 shows an example of moving image data. As shown, the moving image data may include N stationary images. FIG. 3 shows that one stationary image may be divided into a plurality of image blocks. As shown, each stationary image may be divided into a plurality of image blocks with each image block having m pixels horizontally and n pixels vertically, for example. Each image block may be associated with a corresponding block number. The block numbers may be numbered in a horizontal direction, in a vertical direction, or by another method. FIG. 3 shows twenty image blocks although other numbers of image blocks are also possible.

Each image block having m×n pixels may be converted into a one dimensional bit stream (m×n byte) and contained in an information field of a transmission frame.

Figure 4:
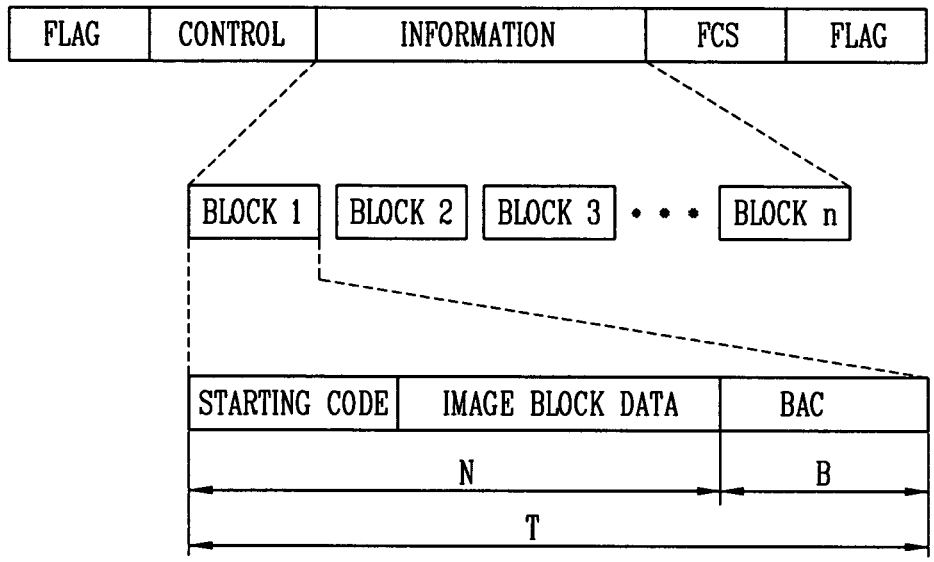
FIG. 4 shows one example of a frame structure used in a moving image transmitting system.

FIG. 4 shows one example of a frame structure used in a moving image transmitting system. As shown, the frame may include a flag (starting) field, a control field, an information field, a frame check sequence (FCS), and a flag (finishing) field.

The flag field may be used to synchronize data transmission and may have a specific pattern. Data transmission blocks may start with the flag field and end with the flag field. The control field may include a destination address and each kind of header.

The FCS field is an error detecting field for certifying whether the transmitted data is properly transmitted or not. This field may be associated with a CRC method, for example.

The information field may include a plurality of data blocks. Each data block may include a starting code, pixel data (m×n pixel value) of an image block (labeled image block data), and a byte alignment code (BAC). As discussed above, a byte alignment code may not always be included in the data block. For example, if a size of the data block is a multiple of eight, then the data block may not have a byte alignment code.

The data block may be divided into meaningful bits and meaningless bits. The meaningful bits may include the starting code and the image block data. In background art, the meaningless bits may include the byte alignment code. However, in accordance with embodiments of the present invention, the byte alignment code may include a channel coding (i.e., an error detection code), and therefore the data block may not include any meaningless bits.

When transmitting moving image data from a transmitting side to a receiving side, the transmitting side may generate an error detection code for each data block. The generated error detection code may be inserted into a byte alignment code of the data block. The data block including the error detection code within the byte alignment code may be transmitted from the transmitting side to the receiving side.

The receiving side may extract the byte alignment code from a data block within the information field of the transmitted frame. The receiving side may check whether an error has occurred with respect to the corresponding image block based on the extracted byte alignment code.

Figure 5:
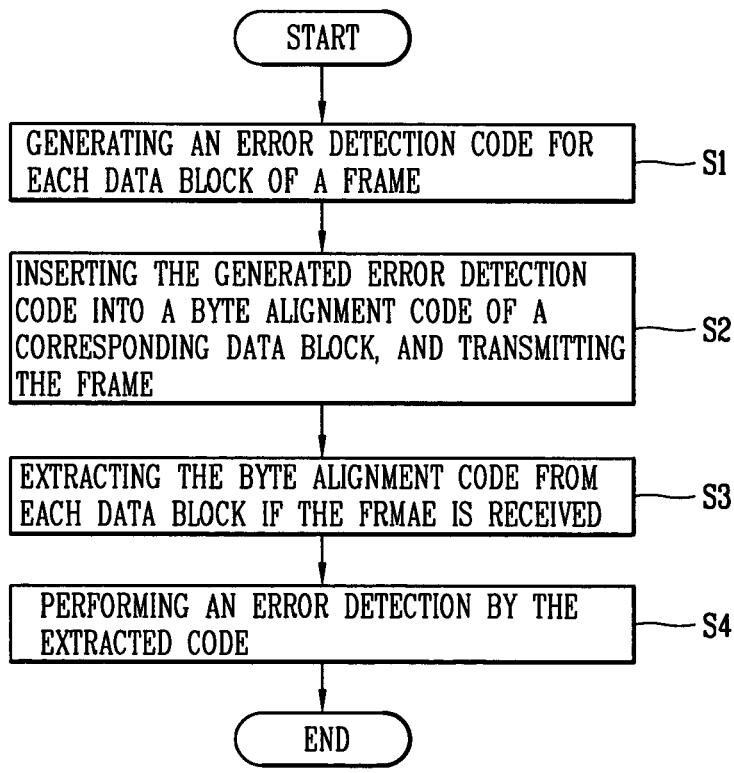
FIG. 5 is a flow chart showing an error detecting method according to an example embodiment of the present invention.

FIG. 5 is a flow chart showing an error detecting method according to an example embodiment of the present invention. Other embodiments are also within the scope of the present invention.

FIG. 5 shows that in operation S1 an error detection code may be generated for each data block of a frame. In operation S2, the generated error detection code may be inserted into a byte alignment code of the corresponding data block. The frame may then be transmitted. In operation S3, the byte alignment code may be extracted from each data block if the frame is received. In operation S4, errors may be detected by the extracted code.

The operation S1 for generating an error detection code may include dividing a minimum unit image (or stationary image) of a moving image into a plurality of image blocks each containing pixel values of the image block, and generating an error detection code for each data block.

The transmitting side may divide each image (i.e., each stationary image) of a moving image into a plurality of image blocks. The transmitting side may convert pixel values of each image block into a one dimensional bit stream. Then, data blocks may be generated having a starting code at a front position of the bit stream and a byte alignment code at (or near) an end position of the bit stream. The generated data blocks may be provided within an information field of transmission data. The data may then be transmitted to a receiving side. The byte alignment code of each data block may include a parity bit for error detection of the corresponding data block. The transmitting side may generate a parity bit having the same size as the byte alignment code.

Figure 6:
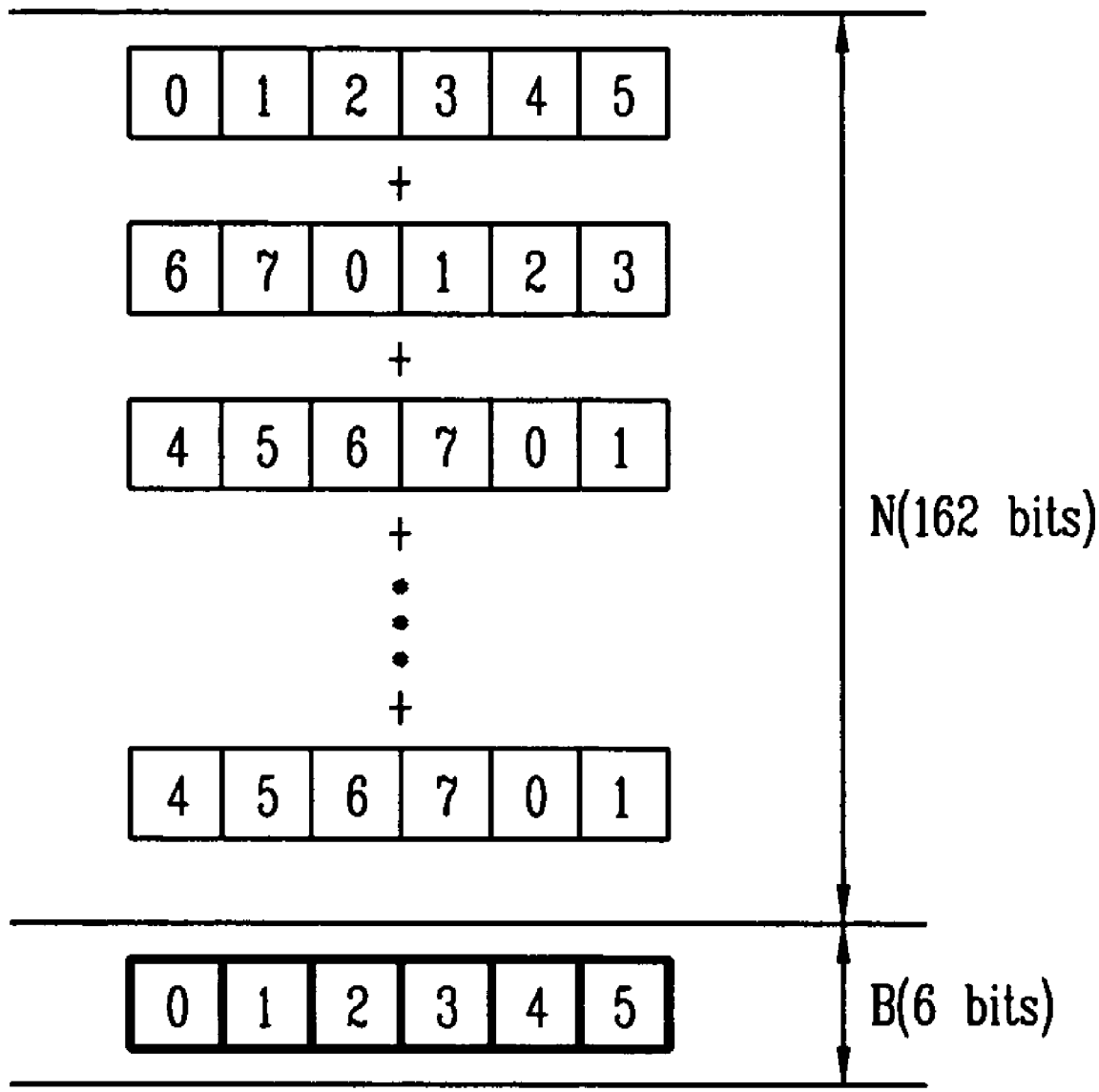
FIG. 6 shows parity bit generation according to an example embodiment of the present invention.

FIG. 6 shows parity bit generation according to an example embodiment of the present invention. Other embodiments are within the scope of the present invention. Once the number of bits of the byte alignment code is determined, then the transmitting side may arrange bits of a corresponding data block as a bit width of the byte alignment code and perform an addition operation (or an exclusive OR) in a vertical direction for the arranged bits so as to obtain parity bits. Then, the obtained parity bits may be inserted into the byte alignment code The following equation may be used to determine the number of bits B of the byte alignment code.

$$B = (8 - (N\%8))\%8 \quad [\%: \text{the rest operation (MOD)}] \quad \text{Equation}$$

Herein, N denotes the number of bits obtained by adding the starting code and pixel values of the image block. For example, if N is 162 bits, then the byte alignment code B is six bits according to the equation.

More specifically, the transmitting side may arrange bits of a corresponding data block by groups of six bits, and perform an addition operation in a vertical direction (or an exclusive OR operation) for the arranged bits so as to obtain the parity bits.

When the moving image data arrives, the receiving side extracts the byte alignment code for each data block within an information field of a received frame. The byte alignment code, for example having 1~7 bits, may be detected between a time point when pixel data of an image block is logically ended and a time point when a next starting code appears. The receiving side may check parity bits for the corresponding data block using the extracted byte alignment code.

In accordance with example embodiments of the present invention, error detection efficiency may be enhanced for each image block by associating a channel code with the byte alignment code. Also, since a byte alignment code having 1~7 bits can be used, a proper channel coding method can be used according to the number of the rest bits (i.e., the number of bits of the byte alignment code). For example, if the byte alignment code is a plurality of bits greater than two bits, then the byte alignment code may be used for CRC checking or parity bit checking. Also, if the byte alignment code is one bit, then the byte alignment code may also be used for parity bit checking.

Parity checking may be performed for a specific part of a bit stream. For example, CRC checking can be performed only for bits of a motion vector part or for a part where a fixed length code is used.

The above-described error detecting method for a moving image transmitting system may enable a moving image encoder to be stably operated and the picture quality to be improved. Also, the method may allow the byte alignment code to be associated with a channel code so as to enhance error detection efficiency.

As discussed above, the moving image system may include a transmitting side and a receiving side. The transmitting side may include a processor capable of providing an error detection code within an alignment field of an image block. The transmitting side may also include a transmitting device to transmit the image across a medium to the receiving side. The receiving side may include a receiving device to receive the transmitted image from the transmitting device across the medium. The receiving side may further include a processor to determine whether an error has occurred before, during or after transmitting based on the transmitted image block received by the receiving device. The processors within each of the transmitting device and the receiving device may operate based on instructions (such as software instructions) that allow the processors to perform the various operations discussed above. These instructions may also be provided on any one of various media and/or storage media.

Embodiments of the present invention may be embodied in several forms without departing from the spirit or essential characteristics thereof. It should also be understood that the above-described arrangements and embodiments are not limited by any of the details of the foregoing description, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An error detecting method comprising:
    generating an error detection code for a data block of an image frame; and
    inserting the generated error detection code within a byte alignment code of the data block.

2. The method of claim 1, further comprising transmitting the frame having the generated error detection code within the byte alignment code.

3. The method of claim 2, further comprising extracting the byte alignment code from the data block.

4. The method of claim 3, further comprising detecting errors within the frame based on the extracted byte alignment code.

5. The method of claim 4, wherein the errors comprise transmission errors.

6. The method of claim 1, wherein a number of bits of the generated error detection code is the same as a number of bits of the byte alignment code.

7. The method of claim 1, wherein the error detection code comprises at least one vertical parity checking bit.

8. The method of claim 1, wherein generating the error detection code comprises:
    dividing a moving image into a plurality of image blocks;
    obtaining pixel values of each image block in each data block; and
    generating the error detection code for each data block.

9. The method of claim 8, wherein generating the error detection code further comprises:
    determining a number of bits of a byte alignment code; and
    generating vertical parity bits of a same number as the determined number of bits.

10. The method of claim 9, wherein the number of bits (B) of the byte alignment code is determined by an equation, $B=(8-(N \%8) )\%8)$, in which N denotes a size of a data block.

11. The method of claim 9, wherein the parity bits are generated based on a vertical parity check.

12. The method of claim 1, wherein the data block comprises a number of bits in which the number of bits is a multiple of eight.

13. An error detecting method comprising:
    providing an error detection code within an alignment field of an image block;
    transmitting the image block having the error detection code; and
    determining whether an error has occurred based on the transmitted image block having the error detection code.

14. The method of claim 13, wherein determining whether an error has occurred comprises:
    extracting the error detection code from the transmitted image block; and
    detecting errors based on the extracted error detection code.

15. The method of claim 13, wherein a number of bits of the error detection code is the same as a number of bits of the alignment code.

16. The method of claim 13, wherein providing the error detection code comprises:
    dividing a moving image into a plurality of image blocks;
    obtaining pixel values of each image block in each data block; and
    generating the error detection code for each data block.

17. The method of claim 16, wherein generating the error detection code comprises:
    determining a number of bits of the alignment code; and
    generating vertical parity bits of a same number as the determined number of bits.

18. The method of claim 17, wherein the number of bits (B) of the alignment code is determined by an equation, $B=(8-(N \%8) )\%8)$, in which N denotes a size of a data block.

19. An image transmitting system comprising:
    a first device to provide an error detection code within an alignment field of an image block; and a second device to transmit the image block having the error detection code within the alignment field.

20. The system of claim 19, further comprising:

a third device to receive the transmitted image block having the error detection code within the alignment field; and a fourth device to determine whether an error has occurred based on transmitted image block received by the third device.

21. The system of claim 20, wherein the fourth device extracts the error detection code from the alignment field of the transmitted image block and detects errors based on the extracted error detection code.

22. An image receiving system comprising:

a first device to receive a transmitted image block having an error detection code within an alignment field; and a second device to determine whether an error has occurred based on the transmitted image block received by the first device.

23. The system of claim 22, further comprising:

a third device to provide the error detection code within the alignment field of the image block; and a fourth device to transmit the image block having the error detection code within the alignment field.

24. The system of claim 22, wherein the second device extracts the error detection code from the alignment field of the transmitted image block and detects errors based on the extracted error detection code.

* * * * *